(12) United States Patent
Aono et al.

(10) Patent No.: US 7,525,410 B2
(45) Date of Patent: Apr. 28, 2009

(54) POINT CONTACT ARRAY, NOT CIRCUIT, AND ELECTRONIC CIRCUIT USING THE SAME

(75) Inventors: Masakazu Aono, Shinagawa-ku (JP); Tsuyoshi Hasegawa, Meguro-ku (JP); Kazuya Terabe, Toda (JP); Tomonobu Nakayama, Soka (JP)

(73) Assignees: Japan Science and Technology Agency, Kawaguchi-shi (JP); Riken, Wako-shi (JP)

( * ) Notice: Subject to any disclaimer, the term of this patent is extended or adjusted under 35 U.S.C. 154(b) by 704 days.

(21) Appl. No.: 11/165,037

(22) Filed: Jun. 24, 2005

(65) Prior Publication Data
US 2005/0243844 A1 Nov. 3, 2005

Related U.S. Application Data

(62) Division of application No. 10/363,259, filed as application No. PCT/JP01/09464 on Oct. 29, 2001, now Pat. No. 7,026,911.

(30) Foreign Application Priority Data

| Nov. 1, 2000 | (JP) | ............................. 2000-334686 |
| May 9, 2001 | (JP) | ............................. 2001-138103 |

(51) Int. Cl.
*H01H 9/00* (2006.01)
(52) U.S. Cl. .................... 338/309; 338/307; 257/533
(58) Field of Classification Search ................ 338/309, 338/307, 308; 257/532, 533, 536, E27.024, 257/E27.025
See application file for complete search history.

(56) References Cited

U.S. PATENT DOCUMENTS 4,187,161 A 2/1980 Fischer (Continued)

FOREIGN PATENT DOCUMENTS

JP 61-230426 10/1986

(Continued)

OTHER PUBLICATIONS

J.L. Costa-Kramer et al.: "Conductance quantization in a nanowires formed between micro and macroscopic metallic electrodes" Physical Review B, vol. 55, No. 8, pp. 5416-5424 Feb. 15, 1997.

(Continued)

*Primary Examiner*—Kyung Lee
(74) *Attorney, Agent, or Firm*—Oblon, Spivak, McClelland, Maier & Neustadt, P.C.

(57) ABSTRACT

There are provided a point contact array, in which a plurality of point contacts are arranged, each point contact electrically and reversibly controlling conductance between electrodes and being applicable to an arithmetic circuit, a logic circuit, and a memory device, a NOT circuit, and an electronic circuit using the same.

A circuit includes a plurality of point contacts each composed of a first electrode made of a compound conductive material having ionic conductivity and electronic conductivity and a second electrode made of a conductive substance. The conductance of each point contact is controlled to realize the circuit. $Ag_2S$, $Ag_2Se$, $Cu_2S$, or $Cu_2Se$ is preferably used as the compound conductive material. When a semiconductor or insulator material is interposed between the electrodes, a crystal or an amorphous material of $GeS_x$, $GeSe_x$, $GeTe_x$, or $WO_x$ ($0<x<100$) is preferably used as the semiconductor or insulator material.

A NOT circuit is realized using a device which includes an atomic switch serving as a two-terminal device, the device including a first electrode made of a compound conductive material having ionic conductivity and electronic conductivity and a second electrode made of a conductive substance, and capable of controlling conductance between the electrodes.

4 Claims, 16 Drawing Sheets

U.S. PATENT DOCUMENTS

| | | | |
|---|---|---|---|
| 4,258,109 A | 3/1981 | Liang et al. | |
| 4,446,059 A | 5/1984 | Eustice | |
| 4,513,070 A | 4/1985 | Carette et al. | |
| 5,023,153 A | 6/1991 | Weppner | |
| 5,459,953 A | 10/1995 | Fukano et al. | |
| 5,464,511 A | 11/1995 | Vlasov et al. | |
| 5,896,312 A | 4/1999 | Kozicki et al. | |
| 6,154,855 A | 11/2000 | Norman | |
| 6,815,749 B1 * | 11/2004 | Mandelman et al. | 257/301 |
| 6,952,042 B2 * | 10/2005 | Stratton et al. | 257/418 |
| 7,026,911 B2 * | 4/2006 | Aono et al. | 338/309 |
| 2003/0035315 A1 | 2/2003 | Kozicki | |
| 2005/0014325 A1 | 1/2005 | Aono et al. | |
| 2005/0127524 A1 | 6/2005 | Sakamoto et al. | |

FOREIGN PATENT DOCUMENTS

| | | |
|---|---|---|
| JP | 9-326514 | 12/1997 |

OTHER PUBLICATIONS

H. Ohnishi et al.: "Quantized conductance through individual rows of suspended gold atoms" Nature, vol. 395, pp. 780-783 Oct. 22, 1998.

U.S. Appl. No. 11/165,037, filed Jun. 24, 2005, Aono et al.

* cited by examiner (a)

(b)

(a)

(b)

| X | Y | S | C |
|---|---|---|---|
| 0 | 0 | 0 | 0 |
| 0 | 1 | 1 | 0 |
| 1 | 0 | 1 | 0 |
| 1 | 1 | 0 | 1 |

POINT CONTACT ARRAY, NOT CIRCUIT, AND ELECTRONIC CIRCUIT USING THE SAME

CROSS REFERENCE TO RELATED APPLICATION

This application is a divisional of patent application Ser. No. 10/363,259, filed Mar 7, 2003, the entire contents of which are incorporated herein by reference. Application Ser. No. 10/363,259 claims the benefit of the priority of Japanese Application Serial No. 2000-334686 filed Nov 1, 2000 and application No. 2001-138103, filed May 9, 2001,and PCT application Ser. No. PCT/JP01/09464, filed Oct 29, 2001, the entire contents of which are incorporated herein by reference.

TECHNICAL FIELD

The present invention relates to a point contact array comprising a plurality of devices in each of which a point contact is formed or disconnected between electrodes facing each other to control conductance, a NOT circuit, and an electronic circuit using the same, and more particularly to a NOT circuit comprising an electronic device (an atomic switch which will be described below) in which a point contact is formed or disconnected between electrodes facing each other to control conductance, and an electronic circuit using the same.

BACKGROUND ART

As related arts [1], methods for forming a point contact to control conductance are disclosed by, for example, J. K. Gimzewski and R. Moller: Phys. Rev. B36, p 1284, 1987, J. L. Costa-Kramer, N. Garcia, P. Garcia-Mochales, P. A. Serena, M. I. Marques, and A. Corrcia: Phys. Rev. B55, p 5416, 1997, and H. Ohnishi, Y. Kondo, and K. Takayanagi: Nature, Vol. 395, p 780, 1998.

Each of these methods requires a piezo device in order to form and control each point contact. In other words, a metallic probe equipped with the piezo device is positioned with respect to an opposite electrode with high precision by driving the piezo device, thus forming a point contact between the probe and the opposite electrode. The state thereof is controlled.

In addition to these arts, as a related art [2], a method for controlling conductance of each point contact, the method using organic molecules is disclosed by C. P. Collier et al.: Science, Vol. 285, p 391, 1999.

According to this method, the conductivity of rotaxane molecules of one molecule thickness sandwiched by electrodes facing each other is changed by applying high voltage between the electrodes. In other words, the rotaxane molecules, sandwiched between the electrodes, initially exhibit the conductivity. When a predetermined or higher voltage of a certain polarity is applied, the molecules are oxidized to reduce the conductivity, so that the electrodes are isolated from each other.

[3] Hitherto, it is known that an AND circuit and an OR circuit can be formed using a diode serving as a two-terminal device.

On the other hand, it is also well-known that a NOT circuit cannot be formed using only the diode. In other words, the NOT circuit cannot be formed using only the conventional two-terminal devices. Accordingly, the formation of the NOT circuit requires a transistor serving as a three-terminal device.

All of logic circuits can be constructed using the combination of the AND circuit, the OR circuit, and the NOT circuit. In other words, a three-terminal circuit is indispensable to the formation of an arbitrary logic circuit. This fact is described in detail in, for example, "NYUMON ELECTRONICS KOHZA (Library of Introduction to Electronics) Digital Circuit", Vol. 2, pages 1 to 7, published by Nikkan Kogyo Shinbun Co., Ltd. (I).

Nowadays as the integration of silicon devices is approaching its limit, new nanometer-sized devices such as molecular devices are being developed. For example, the result of the experiment of a transistor using a carbon nanotube is described in Nature, Vol. 393, pages 49 to 50, 1998 (II).

DISCLOSURE OF INVENTION

According to the method of the foregoing related arts [1], however, one point contact needs at least one piezo device and a complicated control circuit for driving the device. It is very difficult to integrate these components.

According to the method of the foregoing related art [2], since temporarily oxide molecules are reduced and the conductivity cannot be restored, the application is remarkably restricted. Further, for [3], the foregoing three-terminal circuit becomes a factor to inhibit miniaturization.

For example, according to the method of the foregoing document (II), a structure such as a gate other than the carbon nanotube is formed by applying an existing process for manufacturing a semiconductor device. Accordingly, the size of the entire transistor is not so different from that of the conventional transistor. In other words, actually, the development of nanometer-sized devices still remains in the stage of demonstrations of the fundamental principle.

In consideration of the above situations, a first object of the present invention is to provide a point contact array including a plurality of point contacts each of which electrically and reversibly controls conductance between electrodes and each of which is applicable to an arithmetic circuit, a logic circuit, and a memory device.

A second object of the present invention is to provide a NOT circuit including a nanometer-sized electronic device and an electronic circuit using the same.

To accomplish the above objects, according to the present invention,

[1] there is provided a point contact array including a plurality of electronic devices, each of which includes a first electrode made of a compound conductive material having ionic conductivity and electronic conductivity and a second electrode made of a conductive substance and each of which can control conductance between the electrodes.

[2] In the point contact array described in [1], preferably, the compound conductive material having mobile ions (M ion: M denotes a metallic atom) is formed on a source of the mobile ions (M).

[3] In the point contact array described in [1] or [2], preferably, the compound conductive material is $Ag_2S$, $Ag_2Se$, $Cu_2S$, or $Cu_2Se$.

[4] In the point contact array described in [1], [2], or [3], preferably, the mobile ions, contained in the compound conductive material, form a bridge between the first and second electrodes to change the conductance between the electrodes.

[5] In the point contact array described in [1], [2], or [3], preferably, a semiconductor or insulator material, which can dissolve ions and which exhibits electronic conductivity and ionic conductivity due to the dissolution of ions, is arranged between the first and second electrodes, and mobile ions contained in the compound conductive material enter the semiconductor or insulator material to change the conductance of the semiconductor or insulator.

[6] In the point contact array described in [5], preferably, the semiconductor or insulator material is a crystal or an amorphous material of $GeS_x$, $GeSe_x$, $GeTe_x$, or $WO_x$ ($0<x<100$).

[7] In the point contact array described in [1], [2], [3], [4], [5], or [6], preferably, a metallic wire, of which at least one part is covered with the compound conductive material, functions as the first electrode, a metallic wire functions as the second electrode, a plurality of metallic wires functioning as at least one of the electrodes exist, and a point contact is arranged at each intersection of the metallic wires.

[8] In the point contact array described in [1], [2], [3], [4], [5], [6], or [7], preferably, the conductance of each point contact is quantized.

[9] The point contact array described in [8] may function as a multiple recording memory device in which the quantized conductance of each point contact is used as a recording state.

[10] In the point contact array described in [8], preferably, the quantized conductance of each point contact is used as an input signal, and the potentials of the respective electrodes are controlled to perform addition or subtraction of the input signals.

[11] The point contact array described in [1], [2], [3], [4], [5], [6], or [7] may function as a logic circuit in which a potential at one end of each point contact is used as an input signal.

[12] There is provided a NOT circuit including only two-terminal devices.

[13] There is provided a NOT circuit including an atomic switch serving as a two-terminal device.

[14] In the NOT circuit described in [13], preferably, the atomic switch includes a device, which includes a first electrode made of a compound conductive material having ionic conductivity and electronic conductivity and a second electrode made of a conductive substance and which can control conductance between the first and second electrodes.

[15] In the NOT circuit described in [14], preferably, the compound conductive material is $Ag_2S$, $Ag_2Se$, $Cu_2S$, or $Cu_2Se$.

[16] The NOT circuit described in [14] or [15] may include a resistor and a capacitor, each of which serves as a two-terminal device, in addition to the atomic switch.

[17] The NOT circuit described in [16] may include a diode in addition to the resistor and the capacitor.

[18] In the NOT circuit described in [16], preferably, a voltage to be applied to the atomic switch is controlled through the capacitor to control the conductance of the atomic switch.

[19] There is provided an electronic circuit including a combination of the NOT circuit described in any one of [13] to [18], and an AND circuit and an OR circuit, each of which includes the atomic switch.

BEST MODE FOR CARRYING OUT THE INVENTION

Embodiments of the present invention will be described in detail hereinbelow with reference to the drawings.

Figure 1:
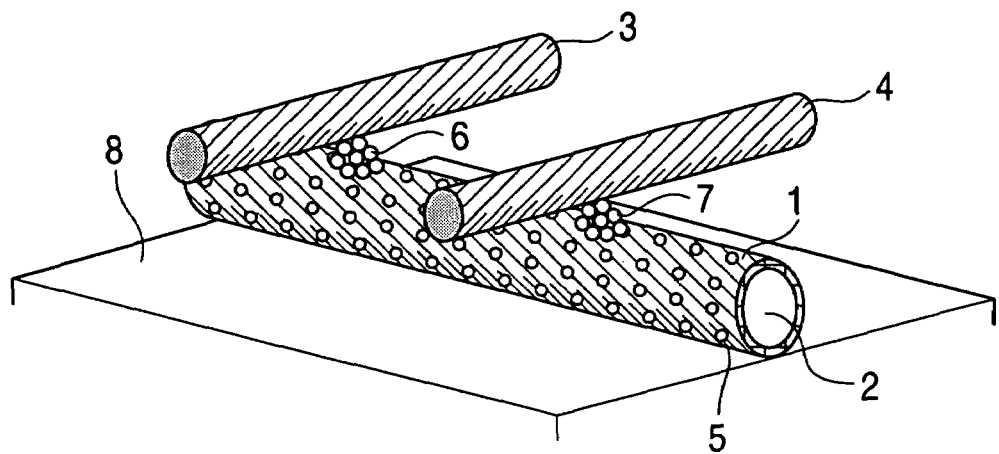
FIG. 1 is a schematic perspective view showing a point contact array, in which a plurality of point contacts are arranged, according to the present invention.

FIG. 1 is a schematic perspective view showing a point contact array, in which a plurality of point contacts are arranged, according to the present invention.

As shown in FIG. 1, point contacts (bridges) 6 and 7 each comprising mobile ions (atoms) 5 are formed at the intersections of a metallic wire (first electrode) 2 and metallic wires (second electrodes) 3 and 4, the metallic wire 2 being covered with an electronic/ionic mixed conductor 1. These components are arranged on an insulating substrate 8 and are then fixed thereto using an insulating material (not shown).

When a semiconductor or insulator material is interposed between the first and second electrodes, mobile ions are dissolved into the semiconductor or insulator to change the conductance of the semiconductor.

Consequently, the conductance between the electrodes is changed. The amount of change depends on the amount of the mobile ions dissolved in the semiconductor or insulator material.

For the sake of simplification, FIG. 1 shows the point contact array comprising the one metallic wire (first electrode) 2, covered with the electronic/ionic mixed conductor 1, and the two metallic wires (second electrodes) 3 and 4. The number of point contacts is obtained by multiplying the number of metallic wires each constituting the electrode. In this case, 2×1, namely, two point contacts are formed. When the number of metallic wires constituting the first and second electrodes is increased, a point contact array having n×n point contacts can be formed.

According to the present invention, a voltage is applied between the first electrode 2 and the second electrodes 3 and 4, resulting in the formation or disappearance of the bridges 6 and 7 comprising ion atoms. Thus, the conductance of each point contact formed between the electrodes is controlled. Specifically, when a proper negative voltage is applied to the second electrodes 3 and 4 with respect to the first electrode 2, mobile ions (atoms) in the electronic/ionic mixed conductive material are precipitated due to effects of voltage and current, resulting in the formation of the bridges 6 and 7 between the electrodes. Consequently, each conductance between the electrodes is increased. On the other hand, when a proper positive voltage is applied to the second electrodes 3 and 4, the mobile ions (atoms) return to the electronic/ionic mixed conductive material, resulting in the disappearance of the bridges 6 and 7. In other words, the conductance is reduced.

As mentioned above, a voltage applied to each metallic wire is independently controlled, so that a voltage applied to the point contact formed at each of the intersections of the first electrode 2 and the second electrodes 3 and 4 can be independently controlled. In other words, the conductance of the point contact at each intersection can be independently controlled.

In this manner, an electronic device such as a memory device or an arithmetic device comprising a point contact array and an electric circuit comprising the electronic devices can be formed.

Embodiments using a first electrode comprising an electronic/ionic mixed conductive material of $Ag_2S$ and an Ag which is a source of mobile ions of Ag and second electrodes comprising Pt will now be described hereinbelow. It is needless to say that the similar results can be obtained using other materials.

When there are about ten atoms of Ag, each bridge can be sufficiently formed. On the basis of the measurement result, on condition that a voltage is 100 mV and initial interelectrode resistance is 100 kΩ, the time required to derive ten Ag atoms from $Ag_2S$ serving as the electronic/ionic mixed conductor, namely, the time required to form a bridge is estimated to be tens of nanoseconds at most. An electric power required to form the bridge is on the order of nanowatts, namely, the power is small. Accordingly, the application of the present invention realizes the construction of a high-speed device with low power consumption.

A first embodiment of the present invention will now be described.

Figure 2:
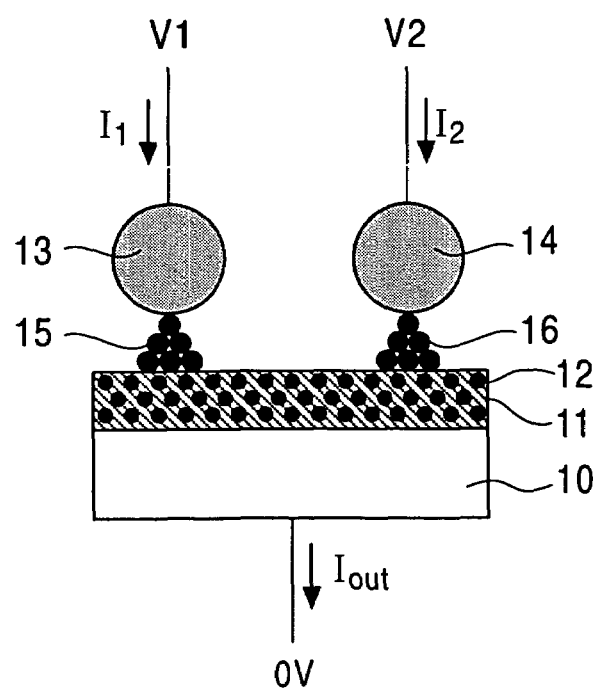
FIG. 2 is a schematic view showing a point contact array constituting a multiple storage memory according to the present invention.

FIG. 2 shows a schematic view of a point contact array according to the present invention, the point contact array being applied to a multiple memory device.

For the sake of simplification, a sample comprising two point contacts is used in a manner similar to FIG. 1. In this case, $Ag_2S$ is used as an electronic/ionic mixed conductive material 11 functioning as a first electrode and an Ag wire is used as a metallic wire 10. Pt wires are used as metallic wires 13 and 14 each functioning as a second electrode. The first electrode is grounded and voltages V1 and V2 are independently applied to the second electrodes 13 and 14, respectively. When negative voltages are used as V1 and V2, Ag atoms 12 contained in the electronic/ionic mixed conductive material 11 are precipitated to form bridges 15 and 16. When positive voltages are used as V1 and V2, the Ag atoms 12 in the bridges 15 and 16 return to the electronic/ionic mixed conductive material 11, resulting in the disappearance of the bridges 15 and 16. Japanese Patent Application No. 2000-265344, by the inventors of the present application, proposes the detailed mechanism.

According to the present invention, the use of a plurality of point contacts realizes a new function, which will be described hereinbelow.

According to the present embodiment, pulse voltages are applied to control the conductance of each point contact. In other words, in order to increase the conductance, a voltage of 50 mV is applied for 5 ms. In order to reduce the conductance, a voltage of −50 mV is applied for 5 ms. Thus, transition in the quantized conductance of each point contact is realized. In other words, the transition corresponds to the writing operation of the memory.

Figure 3:
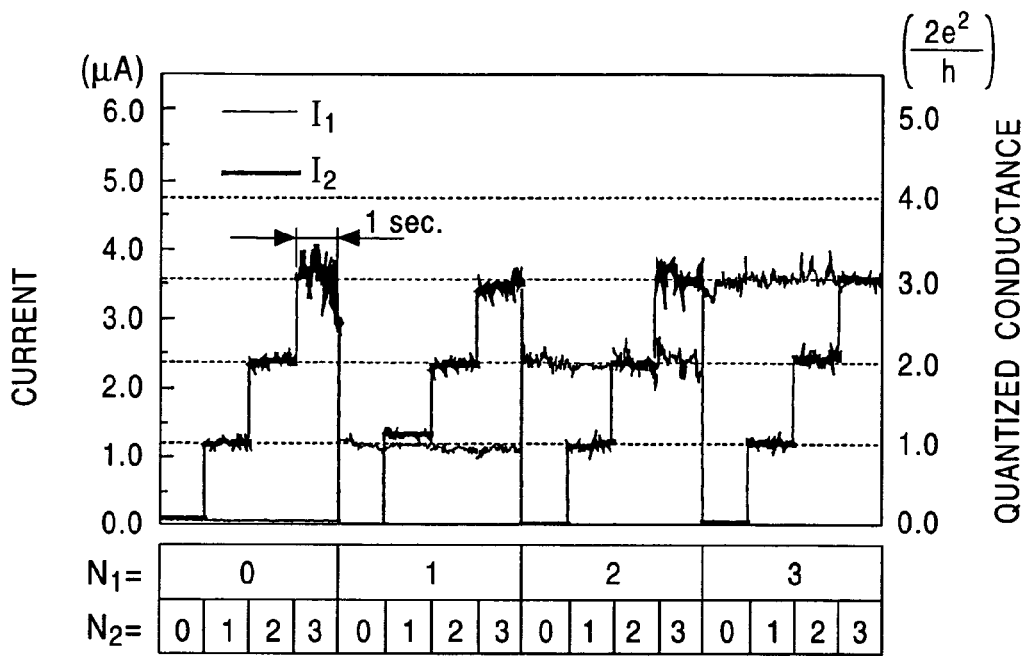
FIG. 3 shows the result of reading of the multiple storage memory according to a first embodiment of the present invention.

In order to read a recording state, V1 and V2 are set to 10 mV so that the recorded conductance is not changed by the reading operation. In this situation, current $I_1$ and $I_2$ flowing through the metallic wires 13 and 14, each functioning as the second electrode of the point contact, are measured. FIG. 3 shows the result.

Referring to FIG. 3, $I_1$ is shown by a thin solid line and $I_2$ is shown by a thick solid line. The point contact 15 or 16 is subjected to the writing operation every second. The recording state is read out after each writing operation. The ordinate axis on the left denotes a current actually measured. The ordinate axis on the right denotes quantized conductance corresponding thereto. The conductance is obtained by dividing the measured current by the applied voltage (10 mV).

It is understood from the graph that the conductance of each point contact is quantized. In other words, when it is assumed that $N_1$ denotes the quantum number of the quantized conductance of a first point contact serving as the bridge 15 and $N_2$ denotes the quantum number of the quantized conductance of a second point contact serving as the bridge 16, $N_1$=0 to 3 and $N_2$=0 to 3, namely, 16 recording states are realized in total.

According to the present embodiment, four quantized states of N=0 to 3 are used. If a state having a larger quantum number is used, the recording density can be increased. It is needless to say that the recording density can also be increased by increasing the number of point contacts.

A second embodiment of the present invention will now be described.

First, an example in which an adding circuit is realized with the configuration shown in the first embodiment will be described.

According to the present invention, inputs denote the quantum numbers $N_1$ and $N_2$ of the quantized conductance of the point contacts serving as the bridges 15 and 16. The input operation is performed by controlling the voltages V1 and V2 to set each of $N_1$ and $N_2$ to a desired value. V1 and V2 are set to a reading voltage, for example, 10 mV and a current $I_{out}$ flowing from the first electrode 10 to a ground potential is measured, thus obtaining the result of an arithmetic operation.

Figure 4:
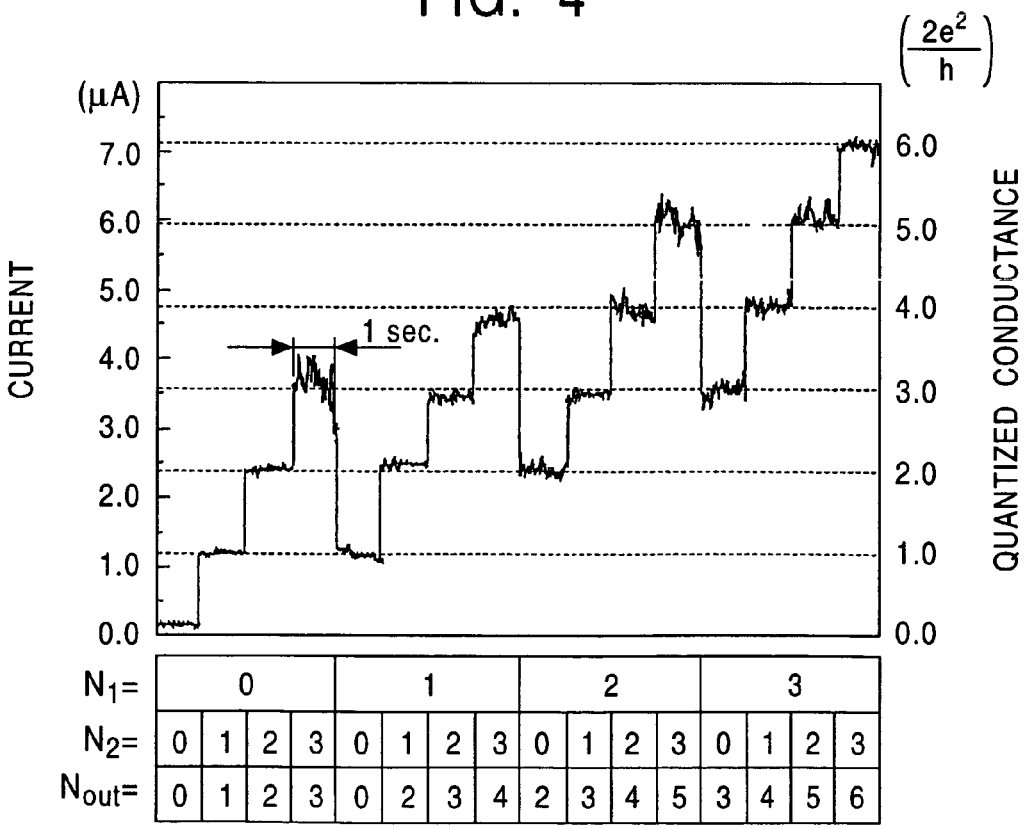
FIG. 4 shows the result of an arithmetic operation by an adding circuit comprising a point contact array according to a second embodiment of the present invention.

FIG. 4 shows the result of the arithmetic operation according to the second embodiment of the present invention. Below a graph, the inputted $N_1$ and $N_2$ and measured $N_{out}$ are shown so as to correspond to the abscissa axis of the graph. It is found that the obtained current $I_{out}$ has quantized conductance corresponding to $(N_1+N_2)$. In other words, the addition is correctly performed. According to the present embodiment, 16 addition results corresponding to $N_1$=0 to 3 and $N_2$=0 to 3 are shown in the same way as the first embodiment. Larger quantum numbers can also be used. For the number of point contacts used, namely, the number of inputs, three or more inputs can also be used.

A third embodiment of the present invention will now be described.

The configuration shown in the first embodiment can also be applied to a subtracting circuit. Inputs are controlled by the same method described in the second embodiment. Upon subtraction, voltages, which have the same absolute value and whose polarities are opposite to each other, can be used as V1 and V2. For example, when V1 is set to 10 mV and V2 is set to −10 mV, the current $I_{out}$ corresponding to quantized conductance, which corresponds to $(N_1-N_2)$, flows from the first electrode to the ground potential. At that time, when the current flows in the direction from the first electrode to the ground potential, the result of the arithmetic operation indicates a positive value. When the current flows in the direction from the ground potential to the first electrode, the result of the arithmetic operation indicates a negative value.

Figure 5:
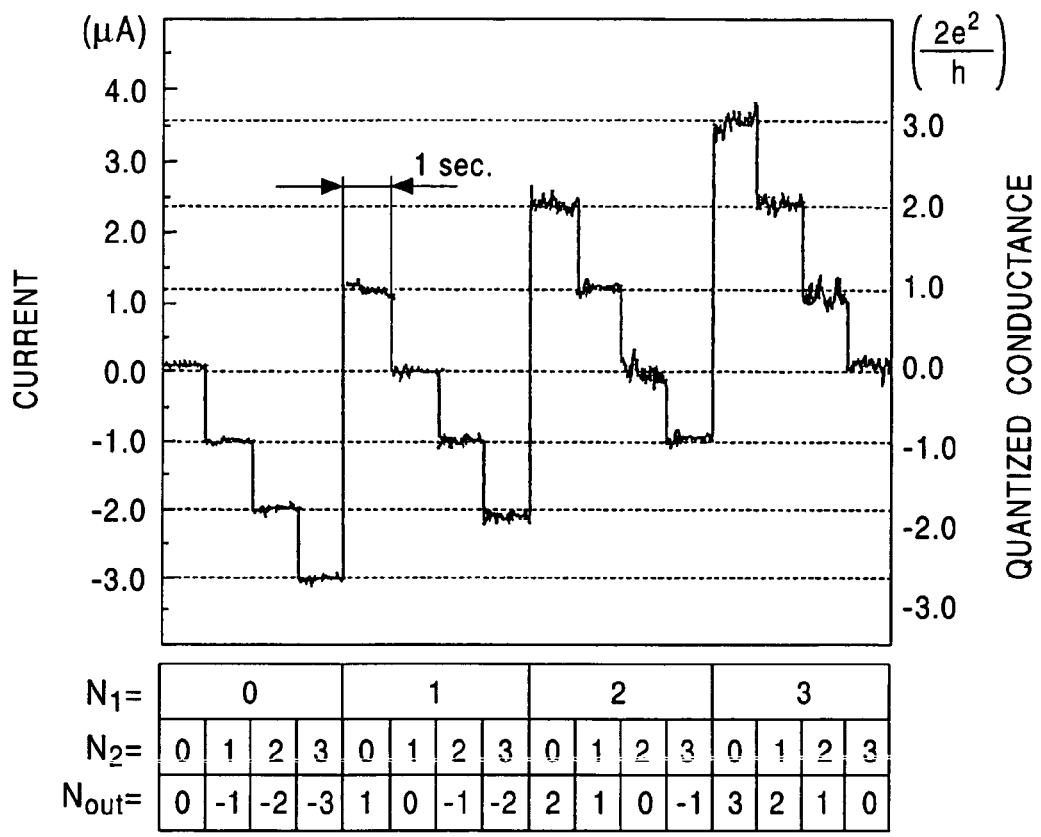
FIG. 5 shows the result of an arithmetic operation by a subtracting circuit comprising a point contact array according to a third embodiment of the present invention.

FIG. 5 shows the result of the arithmetic operation according to the third embodiment.

The arithmetic operation of $(N_1-N_2)$ is correctly performed. Further, if three or more point contacts are used, an arithmetic operation of $(N_1+ N_2-N_3)$ can be performed at a time. In this case, for example, on condition that V1 and V2 are set to 10 mV and V3 is set to −10 mV, the arithmetic operation can be performed.

A fourth embodiment of the present invention will now be described.

According to the present embodiment, a logic circuit is constructed using the point contacts according to the present invention. For the configuration of the logic circuit, in contrast to the first to third embodiments, the transition in the quantized conductance of each point contact is not used. In other words, the point contact is used as an on-off switching device. Typically, a resistance in the ON state is equal to or less than 1 kΩ and a resistance in the OFF state is equal to or more than 100 kΩ.

Figure 6:
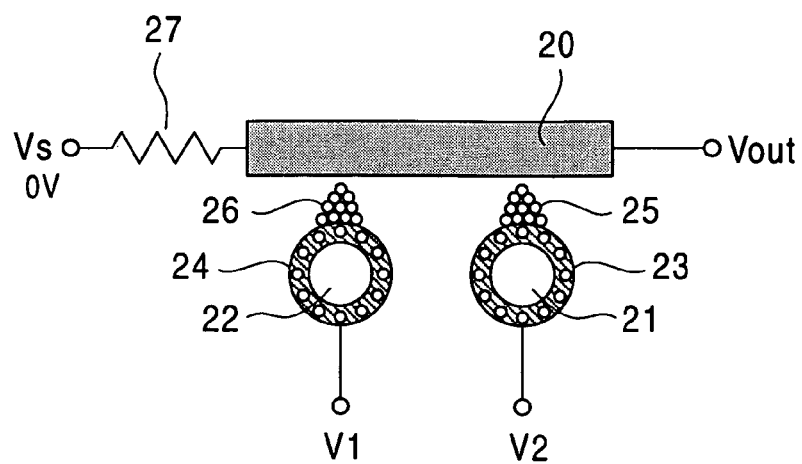
FIG. 6 is a schematic diagram of an OR gate comprising a point contact array according to a fourth embodiment of the present invention.

FIG. 6 is a schematic diagram of an OR gate formed using the point contacts according to the present invention.

Ag wires 21 and 22 are covered with $Ag_2S$ 23 and 24, respectively, thus forming first electrodes. Ag bridges 25 and 26, formed on the $Ag_2S$ 23 and 24, face a Pt electrode 20 serving as a second electrode, thus forming point contacts. One end of the Pt electrode 20 is connected to a reference voltage Vs through a resistance 27 (10 kΩ in the present embodiment) and the other end functions as an output terminal to generate an output voltage $V_{out}$. Input voltage V1 and V2 are applied to the Ag wires 21 and 22, resulting in the formation or disappearance of the bridges 25 and 26. Thus, each point contact functions as an on-off switching device.

Figure 7:
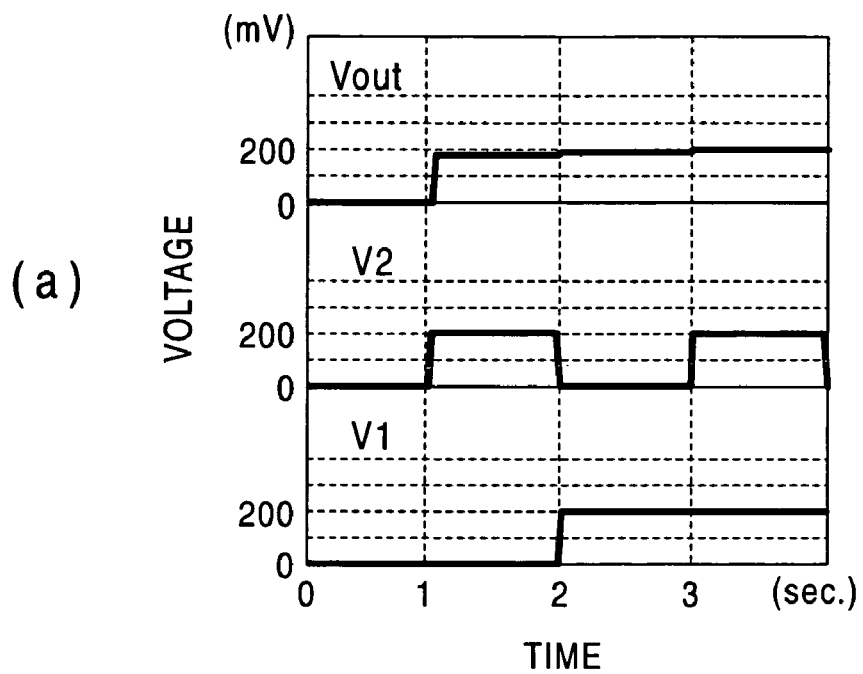
FIG. 7 shows the results of the operation of an OR gate comprising a point contact array according to the fourth embodiment of the present invention.
Figure 7:
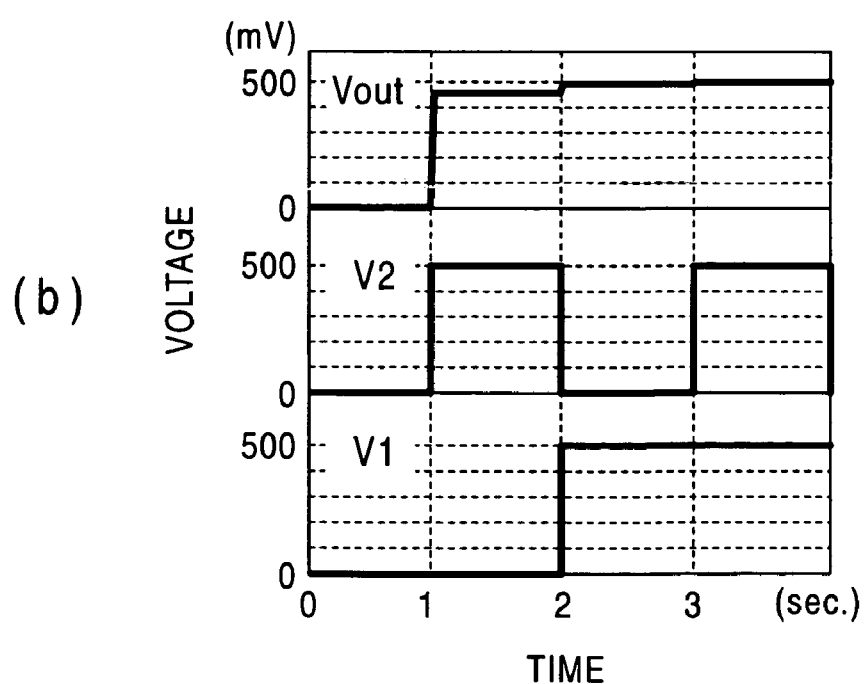

FIG. 7 shows the results of the operation. According to the present embodiment, the inputs, namely, V1 and V2 are changed every second to measure the output $V_{out}$.

In a two-input OR gate, for binary low-level and high-level inputs, if either input indicates a high level, an output must go to a high level.

The OR gate is operated using 0V (the reference potential Vs also has the same value) as a low-level input and 200 mV as a high-level input. FIG. 7(*a*) shows the result of this case.

When either one of the two inputs V1 and V2 is 200 mV, the output $V_{out}$ substantially indicates 200 mV. The normal operation is found from the graph. When a high-level voltage is increased to 500 mV, the similar result (FIG. 7(*b*)) is obtained.

Figure 8:
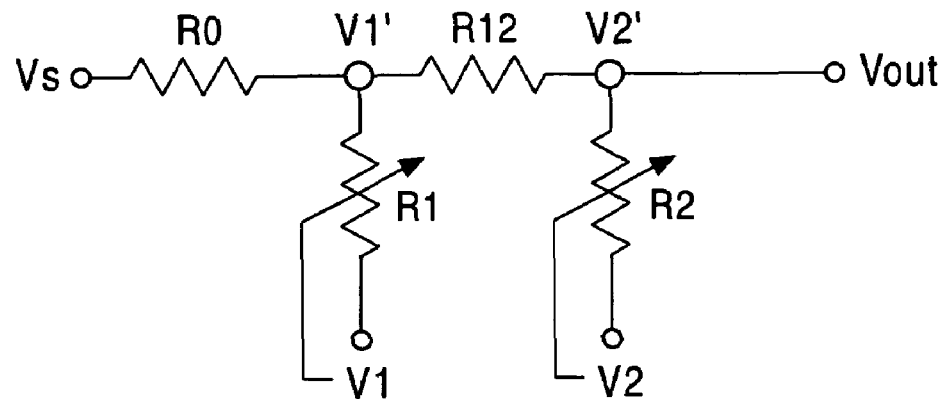
FIG. 8 is an equivalent circuit diagram of a point contact array logic circuit according to the fourth embodiment of the present invention.

FIG. 8 is an equivalent circuit diagram of the present logic circuit.

The reference voltage Vs and the input voltages V1 and V2 cause the formation or disappearance of the bridges 25 and 26 (FIG. 6), resulting in a change in the resistance of each of resistors R1 and R2 (resistances of the point contacts formed by the bridges). Although there is a small resistance R12 (about several ohms to tens of ohms) between two point contacts on the electrode 20 (FIG. 6), the resistance is negligible as compared to R0 (10 kΩ), and R1 and R2 (1 kΩ to 1 MΩ).

First, when both of V1 and V2 are 0 V, all of the three voltages connected to the system indicate 0 V. Therefore, the output $V_{out}$ necessarily indicates 0 V. Subsequently, when V1 is 0V and V2 is 200 mV (500 mV), the bridge 25 (FIG. 6) grows and the resistance of the resistor R2 decreases. Typically, the resistance is equal to or less than 1 kΩ.

Consequently, since the resistance of R2 is an order or more of magnitude smaller than that of R0, V2' indicates about 200 mV (500 mV). At this time, since V1' also indicates about 200 mV (500 mV), a voltage whereby a bridge disappears is applied to the bridge 26 (FIG. 6), so that R1 indicates a large value of 1 MΩ or higher. Consequently, when V1 is 0 V, R0, R1>>R2. Accordingly, V1' indicates about 200 mV (500 mV) that is equivalent to V2'. Thus, the output indicates 200 mV (500 mV). To be precise, the growth of the bridge 25 and the disconnection of the bridge 26 simultaneously occur, thus causing the above-described result.

In a case where V1 is 200 mV (500 mV) and V2 is 0 V, the similar explanation can be applied to the case. When both of V1 and V2 are 200 mV (500 mV), both of the bridges 25 and 26 grow. Consequently, the voltage of V1 and V2, namely, 200 mV (500 mV) is generated.

A fifth embodiment of the present invention will now be described.

Figure 9:
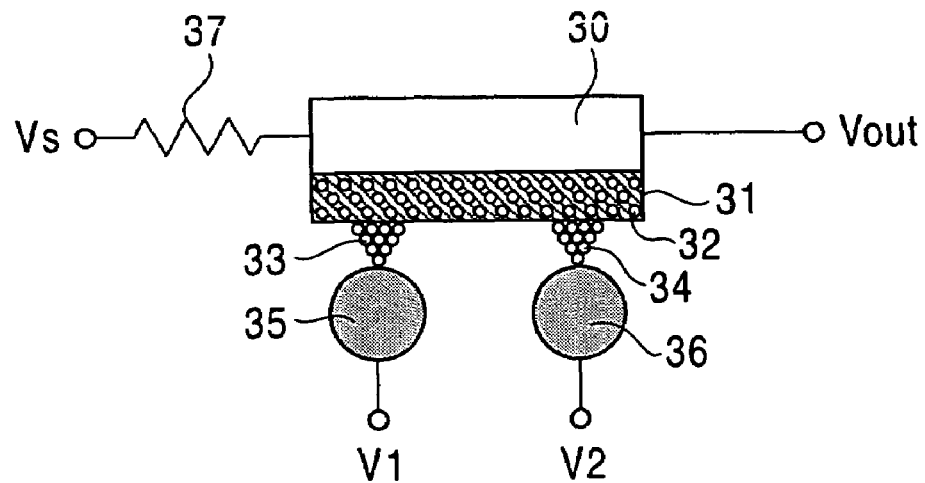
FIG. 9 is a schematic diagram of an AND gate comprising a point contact array according to a fifth embodiment of the present invention.

According to the present embodiment, the configuration of an AND gate will be described with reference to FIG. 9.

According to the present embodiment, one end of an Ag wire 30, covered with an $Ag_2S$ thin film 31, is connected to a reference voltage Vs through a resistor 37. The other end is an output terminal. Bridges 33 and 34, formed by precipitation of Ag atoms serving as mobile ions, are formed so as to face two Pt electrodes 35 and 36, respectively. Input voltages V1 and V2 are applied to the two Pt electrodes 35 and 36. In FIG. 9, reference numeral 32 denotes an Ag ion in the $Ag_2S$ thin film 31.

Figure 10:
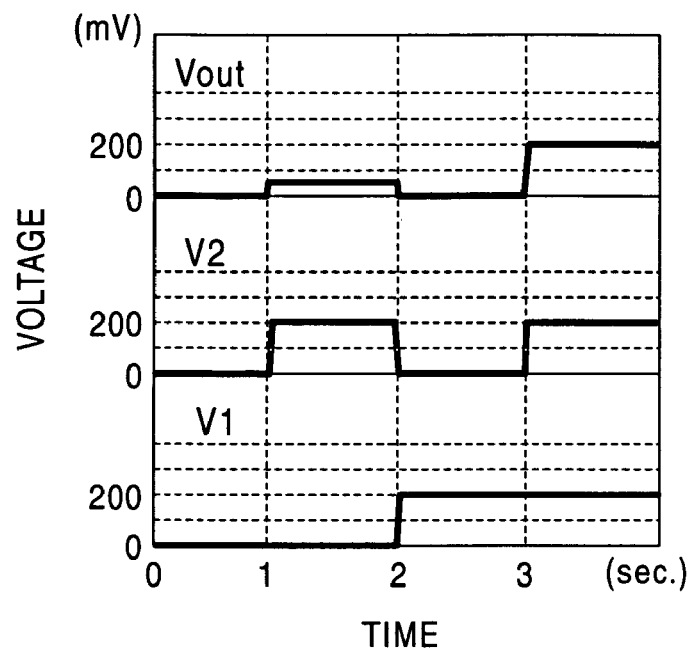
FIG. 10 shows the results of the operation of the AND gate comprising the point contact array according to the fifth embodiment of the present invention.
Figure 10:
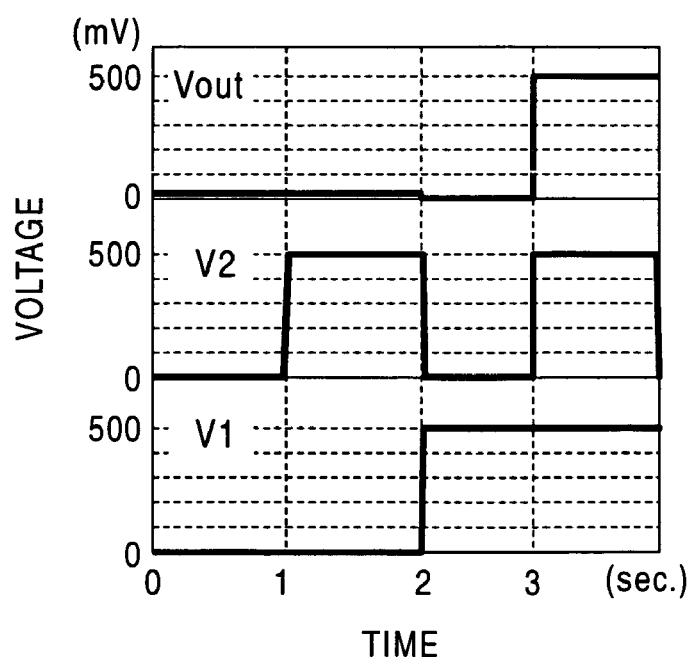

FIG. 10 shows the results of the arithmetic operation of the AND gate. In the two-input AND gate, when both of the two inputs are at a high level, an output $V_{out}$ goes to a high level.

FIG. 10(*a*) shows the result of the operation on condition that the high level is set to 200 mV. In this instance, a reference voltage is also set to 200 mV.

FIG. 10(b) shows the result of the operation on condition that the high level is set to 500 mV. In this instance, the reference voltage is 500 mV.

Referring to FIG. 10, when the high level is set to 200 mV, V1 is 0V, and V2 is 200 mV, the output $V_{out}$ indicates a partial value (about 50 mV). However, in the other cases, the output indicates 0V as the low level or 200 mV as the high level. When the high level is set to 500 mV, the normal operation is performed in all of input patterns. In the case of the operation using 200 mV, when a critical voltage to determine low-high levels is set to 100 mV, no problem occurs. The cause will be described below.

The principle of the operation of the AND gate will be described again with reference to FIG. 8. According to the present embodiment, the reference voltage Vs is at the high level (200 or 500 mV). First, when both of V1 and V2 are 0 V, both of the bridges 33 and 34 (FIG. 9) grow. Thus, the resistance of each of the resistors R1 and R2 is typically equal to or less than 1 kΩ. In other words, the input voltages at the low level are connected to the output terminal through resistances which are one order or more of magnitude smaller than the resistance R0 (10 kΩ). Accordingly, the output $V_{out}$ indicates 0 V. Subsequently, when V1 is 0V and V2 is 200 mV (500 mV), the bridge 33 (FIG. 9) alone grows.

On the other hand, in the bridge 34, the voltage V2' is smaller than 200 mV (500 mV) due to the voltage V1. In other words, the voltage of a polarity, which allows the bridge to disappear, is applied to the bridge 34, resulting in the disappearance of the bridge 34. The resistance of R2 is increased to about 1 MΩ. In this instance, when a potential difference between V2' and V2 is small, the bridge disappears insufficiently. Therefore, the resistance of R2 is not increased enough. Accordingly, the above-mentioned partial output may be generated. However, when a high-level voltage is set to 500 mV, the potential difference between V2' and V2 is increased enough. Thus, the completely normal operation is realized.

The same description applies in the case where V1 is 200 mV (500 mV) and V2 is 0 V. Since the characteristics of the bridges 33 and 34 each constituting the point contact are slightly different from each other, a normal output is obtained in the case where an operating voltage is 200 mV. Finally, when both of V1 and V2 are 200 mV (500 mV), the formation or disappearance of the bridges 33 and 34 does not occur. Since all of voltages are 200 mV (500 mV), an output voltage also indicates 200 mV (500 mV).

The logic circuits using the point contacts have been described. According to the foregoing embodiments, the two-input logic circuits have been explained. When three or more point contacts according to the present invention are used, a logic circuit having three or more inputs can be formed on the basis of the above-mentioned principle of operation.

A sixth embodiment according to the present invention will now be described.

A method for forming a point contact array will be described.

Figure 11:
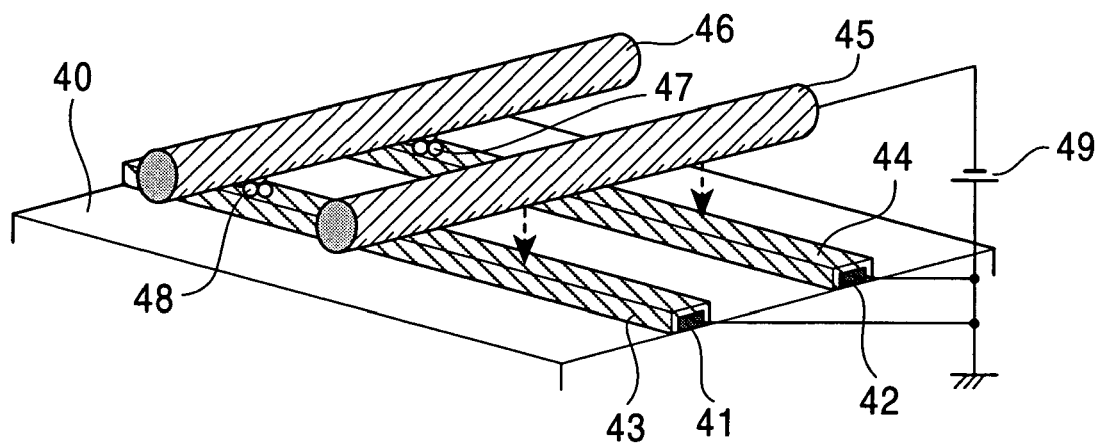
FIG. 11 is a view showing a method for forming a point contact array according to a sixth embodiment of the present invention.

FIG. 11 is a diagram showing the method for forming a point contact array according to the sixth embodiment of the present invention.

As shown in FIG. 11, Ag wires 41 and 42 are formed on an insulating substrate 40. The surfaces of the Ag wires are sulfurized to form $Ag_2S$ films 43 and 44. Pt wires 45 and 46 are disposed thereon. Thus, an essential part of the point contact array is completed. It is important that bridges 47 and 48 comprising Ag atoms are formed at the intersections of the Ag wires 41 and 42 and the Pt wires 45 and 46, the Ag wires 41 and 42 being covered with the $Ag_2S$ films 43 and 44, respectively.

According to the present invention, therefore, when the Pt wires 45 and 46 are arranged, a voltage is applied between the Pt wires 45 and 46 and the Ag wires 41 and 42 to precipitate Ag on the $Ag_2S$ film 43 and 44, resulting in the formation of the bridges 47 and 48. Consequently, when the Pt wires 45 and 46 are arranged using, for example, a wiring system or the like, the present invention can be realized.

The bridge can be previously formed at each intersection by evaporation of Ag through a mask. Alternatively, electron beams can be irradiated on each Ag wire covered with the $Ag_2S$ film to precipitate Ag atoms. It is important that Ag exists between $Ag_2S$ functioning as a first electrode and Pt functioning as a second electrode.

Furthermore, Pt wires can be previously formed on another substrate and be then adhered to the substrate having the Ag wires covered with the $Ag_2S$ films.

A seventh embodiment of the present invention will now be described.

A method for forming another point contact array and the structure thereof will be described.

Figure 12:
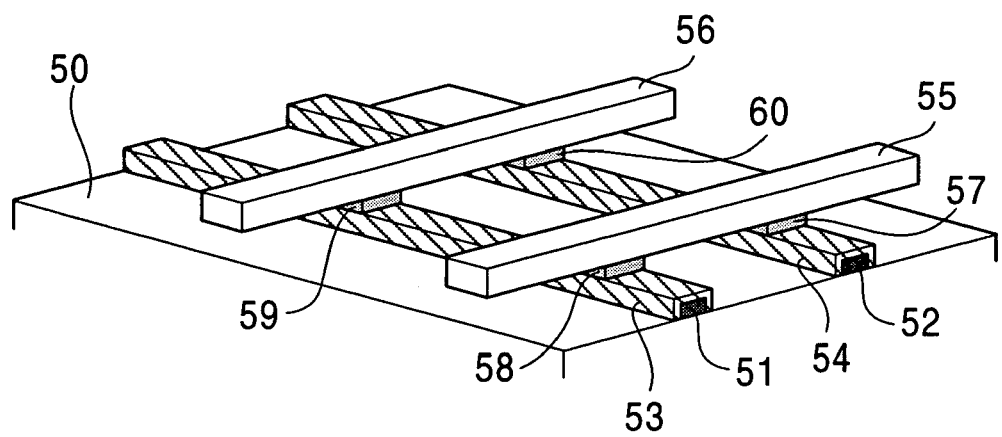
FIG. 12 is a schematic view of a point contact array according to a seventh embodiment of the present invention, the point contact array controlling the conductivities of semiconductors.

FIG. 12 is a schematic view of a point contact array according to the seventh embodiment of the present invention, the point contact array controlling the conductivity of each semiconductor.

Referring to FIG. 12, Ag wires 51 and 52, respectively covered with $Ag_2S$ films 53 and 54, are formed on an insulating substrate 50. Further, semiconductors or insulators 57, 58, 59, and 60, which can dissolve Ag atoms, are formed only at the intersections of the Ag wires 51 and 52 and the Pt wires 55 and 56. In FIG. 12, an insulating material covering these components are not shown. All of the components shown in the diagram are embedded in a device.

In this case, according to the same principle as that described above, Ag ions move from the $Ag_2S$ films 53 and 54. The moving Ag ions are dissolved into the semiconductors or insulators 57, 58, 59, and 60 to change the conductivity of each semiconductor or insulator. Thus, the similar effects as those in the above-mentioned embodiments can be realized. In this case, since a space where the formation or disappearance of the bridges is not needed in the device, these components can be easily embedded in an insulating member.

When Ag thin films are previously formed in place of the semiconductors or insulators, the same structure as that described in the sixth embodiment is obtained. In this case, Ag atoms contained in the Ag thin films enter the $Ag_2S$ films, resulting in the disappearance of the thin film.

According to the present invention, crystals or amorphous materials of $GeS_x$, $GeSe_x$, $GeTe_x$, or $WO_x$ (0<x<100) are used as the semiconductors or insulators which can dissolve the Ag ions.

An eighth embodiment of the present invention will now be described.

Figure 13:
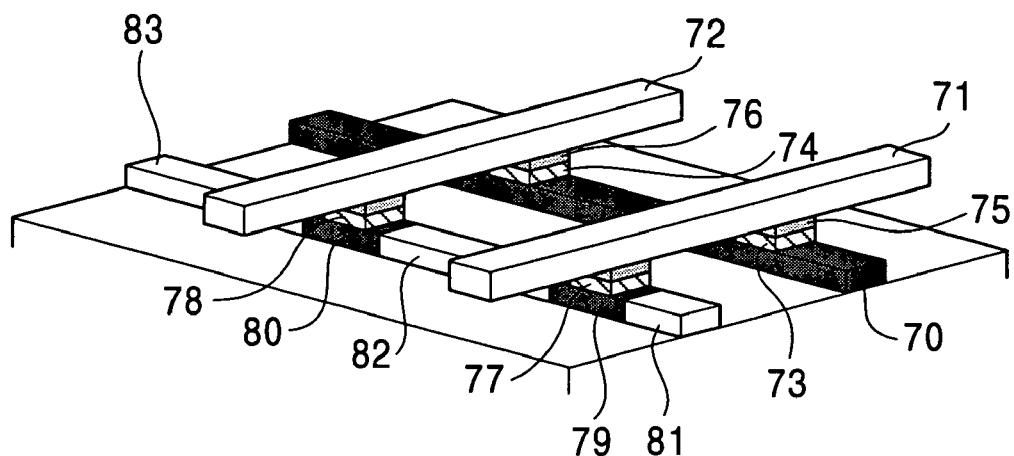
FIG. 13 is a schematic view of a point contact array according to an eighth embodiment of the present invention, the point contact array having electrodes partially covered with a compound conductor.

FIG. 13 shows an embodiment in which a part of each metallic wire serving as a first electrode is covered with an electronic/ionic mixed conductor. According to the present embodiment, it is enough to form point contacts, each comprising "a metal serving as a first electrode, an electronic/ionic mixed conductor, a bridge or a semiconductor, and a metal serving as a second electrode", at the intersections of the metallic wire functioning as the first electrode and metallic wires each functioning as the second electrode.

Therefore, as shown in FIG. 13, when electronic/ionic mixed conductors 73 and 74 are formed only in the vicinity of the intersections of a metallic wire 70 functioning as a first electrode and metallic wires 71 and 72 each functioning as a second electrode, a point contact (bridge) 75 can be formed between the electronic/ionic mixed conductor 73 and the metallic wire 71 and a point contact (bridge) 76 can be formed between the electronic/ionic mixed conductor 74 and the metallic wire 72.

Furthermore, for the metal serving as the first electrode, each part which is in contact with the electronic/ionic mixed conductor can be different from a material of the wire between the point contacts. According to the present embodiment, for example, Ag wires 79 and 80 are used as parts which are in contact with electronic/ionic mixed conductors ($Ag_2S$) 77 and 78, respectively. Tungsten wires are used as other parts 81 to 83. For the material of each part to be in contact with the electronic/ionic mixed conductor, it is necessary that each part comprise the same element as the mobile ions in the electronic/ionic mixed conductor. According to the present embodiment, therefore, since $Ag_2S$ is used as the electronic/ionic mixed conductor, Ag is used as a material for the part which is in contact therewith.

A NOT circuit according to another embodiment of the present invention and an electronic circuit using the same will now be described in detail hereinbelow.

Figure 14:
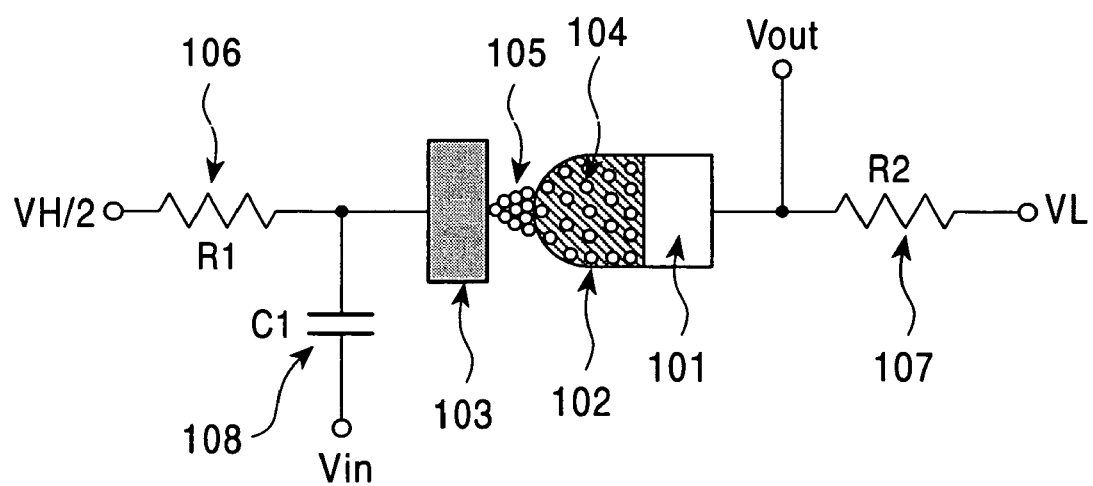
FIG. 14 is a schematic diagram of a NOT circuit according to a ninth embodiment of the present invention.

FIG. 14 is a schematic diagram of a NOT circuit according to a ninth embodiment of the present invention.

As shown in the diagram, a first electrode 102 serving as an electronic/ionic mixed conductor is formed on a conductive substance 101. A potential difference between the first electrode 102 and a second electrode 103 is controlled, thus controlling so that mobile ions (atoms) 104 in the electronic/ionic mixed conductor are precipitated as metallic atoms on the surface of the first electrode 102, alternatively, the precipitated metallic atoms are dissolved as mobile ions (atoms) into the first electrode 102. In other words, when a proper negative voltage is applied to the second electrode 103 with respect to the first electrode 102, the mobile ions (atoms) 104 in the electronic/ionic mixed conductive material is precipitated due to the effect of voltage and current, thus forming a bridge 105 between the electrodes 102 and 103. Consequently, resistance between the electrodes 102 and 103 decreases.

On the contrary, when a proper positive voltage is applied to the second electrode 103, the mobile ions (atoms) 104 are dissolved into the electronic/ionic mixed conductive material, resulting in the disappearance of the bridge 105. In other words, the resistance increases. Hereinbelow, such a two-terminal device will be called an "atomic switch". Japanese Patent Application No. 2000-265344, by the inventors of the present application, proposes the detailed principle of operation thereof.

A voltage VH/2 corresponding to a high-level output is applied to the second electrode 103 of the atomic switch through a resistor 106 (resistance R1). An input terminal $V_{in}$ is connected to the second electrode 103 through a capacitor 108 (capacitance C1). On the other hand, a voltage VL corresponding to a low-level output is applied to the conductive substance 101 functioning as the first electrode 102 of the atomic switch through a resistor 107 (resistance R2). An output terminal $V_{out}$ is connected to the conductive substance 101.

It is assumed that R(ON) denotes a resistance of the atomic switch in the ON state and R(OFF) denotes a resistance thereof in the OFF state. According to the present invention, the resistors and the atomic switch which satisfy the following relation are used.

$$R(OFF) \gg R2 \gg R(ON) \sim R1$$

For the input $V_{in}$, VH is used as a high-level input and VL is used as a low-level input. When the input $V_{in}$ is VL, the output $V_{out}$ indicates VH/2. When the input $V_{in}$ is VH, the output $V_{out}$ indicates VL. In other words, when the input is at a high level, the output goes to a low level. When the input is at a low level, the output goes to a high level. Thus, the atomic switch functions as a NOT circuit.

Hereinbelow, an embodiment using an atomic switch, in which $Ag_2S$ formed on Ag is used as the first electrode 102 and Pt is used as the second electrode 103, will now be described. It is needless to say that a NOT circuit can be formed using an atomic switch having another electronic/ionic mixed conductor such as $Ag_2Se$, $Cu_2S$, or $Cu_2Se$ and a metal other than Pt.

As mentioned above, according to the present invention, the use of the atomic switch, serving as a two-terminal device comprising the first electrode 102 made of an electronic/ionic mixed conductive material and the second electrode 103 made of a conductive substance, realizes a NOT circuit comprising only the two-terminal devices.

In this instance, the case where VH is used as the high-level input $V_{in}$ and VL (0 V) is used as the low-level input will be used as an example and the principle of operation of the NOT circuit shown in FIG. 14 will now be described in detail with reference to FIG. 15.

Figure 15:
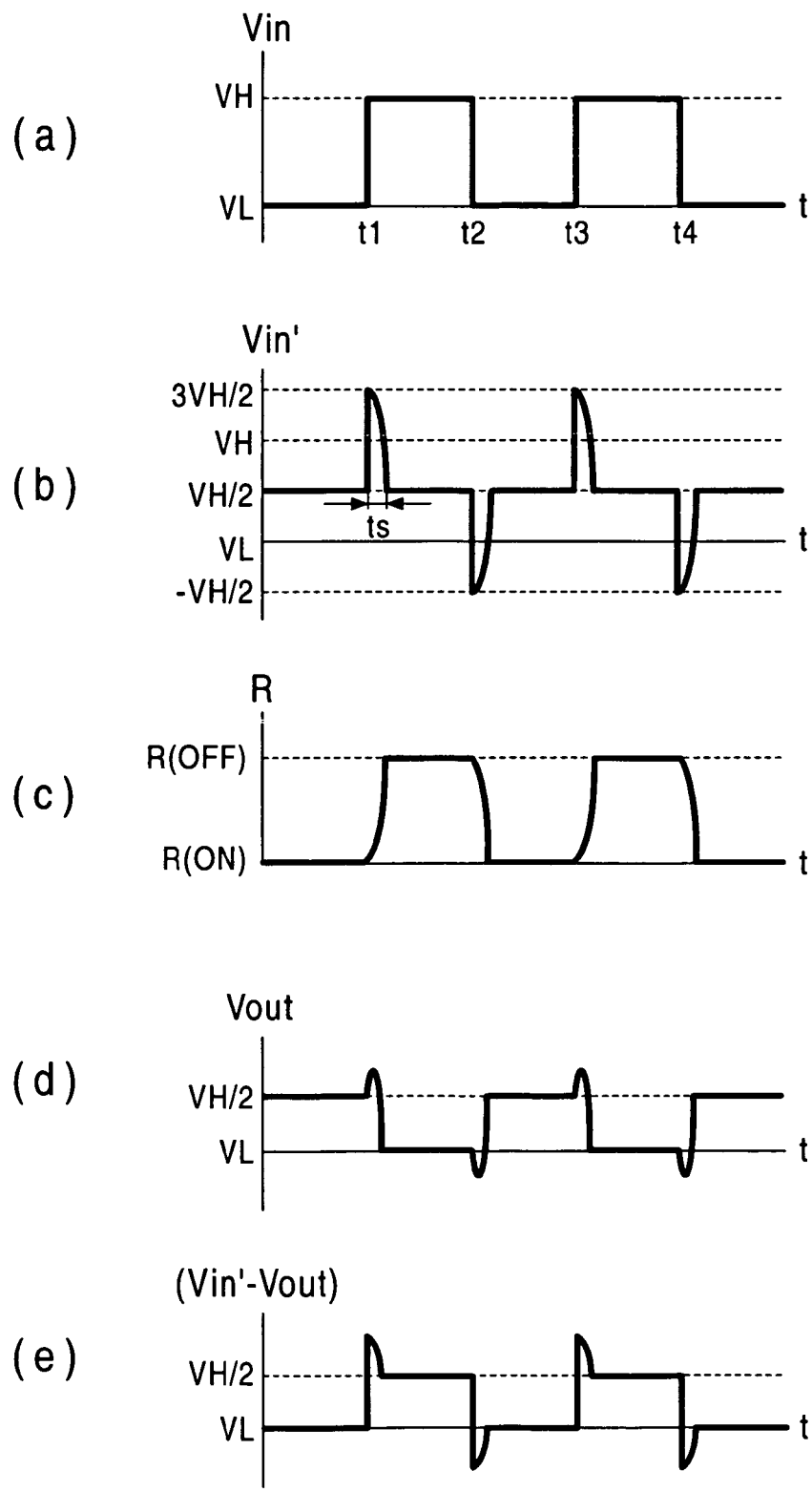
FIG. 15 includes graphs showing a principle of the operation of the NOT circuit according to the ninth embodiment of the present invention.

When the input $V_{in}$ changes from a low level (VL) to a high level (VH) at time t1 [refer to FIG. 15($a$)], charges $Q=C1 \times VH$ (C1 denotes the capacitance of the capacitor) are accumulated in the capacitor 108. At this time, a potential $V_{in}'$ of the second electrode 103 of the atomic switch changes due to a current, which temporarily flows, as shown in FIG. 15($b$). In other words, the potential of the second electrode 103 of the atomic switch is temporarily higher than that of the first electrode 102, so that the atomic switch changes to the OFF state (high resistance) [refer to FIG. 15($c$)]. Thus, R(OFF)$\gg$R2. The output $V_{out}$ indicates VL [refer to FIG. 15($d$)].

Since the resistance of the atomic switch is increased, the potential between the electrodes 102 and 103 of the atomic switch is increased as shown in FIG. 15($e$). Switching time ts is almost determined by the capacitance C1 of the capacitor 108 and the resistance R1 of the resistor 106. For instance, when it is assumed that the capacitance C1 of the capacitor is 1 pF and the resistance R1 is 10 Ω, switching can be performed on the order of gigahertzs.

On the other hand, when the input $V_{in}$ changes from the high level (VH) to the low level (VL) at time t2 [refer to FIG. 15($a$)], the charges accumulated in the capacitor 108 are discharged. Due to a current which temporarily flows, the potential $V_{in}'$ of the second electrode 103 of the atomic switch changes as shown in FIG. 15($b$). In other words, the potential of the second electrode 103 in the atomic switch is temporarily remarkably lower than that of the first electrode 102, so that the atomic switch changes to the ON state (low resistance) [refer to FIG. 15($c$)]. Consequently, R2$\gg$R(ON). The output $V_{out}$ indicates VH/2 [refer to FIG. 15($d$)].

FIG. 15($e$) shows the potential difference between the electrodes 102 and 103 of the atomic switch. When the input $V_{in}$ is at the low level (VL), the potential difference between the electrodes 102 and 103 of the atomic switch indicates about zero. Thus, the ON state of the atomic switch is held stably. On the other hand, when the input $V_{in}$ is at the high level (VH), the potential difference between the electrodes 102 and 103 of the atomic switch indicates VH/2. This value indicates the potential difference at which the atomic switch should be in the OFF state. Therefore, the OFF state is held stably. In other words, the NOT circuit according to the present embodiment operates with reliability and stability.

According to the present embodiment, the case where VH or VL is used as an input and VH/2 or VL is used as an output is described. In the NOT circuit shown in FIG. 14, according to the principle of operation of the atomic switch, under limitations that a potential difference between inputs (in the present embodiment, VH–VL) has to always be larger than a potential difference between outputs (in the present embodiment, VH/2–VL), the potential difference between inputs and that between outputs can be freely set within the limitations.

In the eleventh and twelfth embodiments, a case where the potential difference between inputs is equivalent to that between outputs will be described in detail. In other words, according to the present invention, a NOT circuit in which the level of an input is equivalent to the level of an output can be formed.

Figure 16:
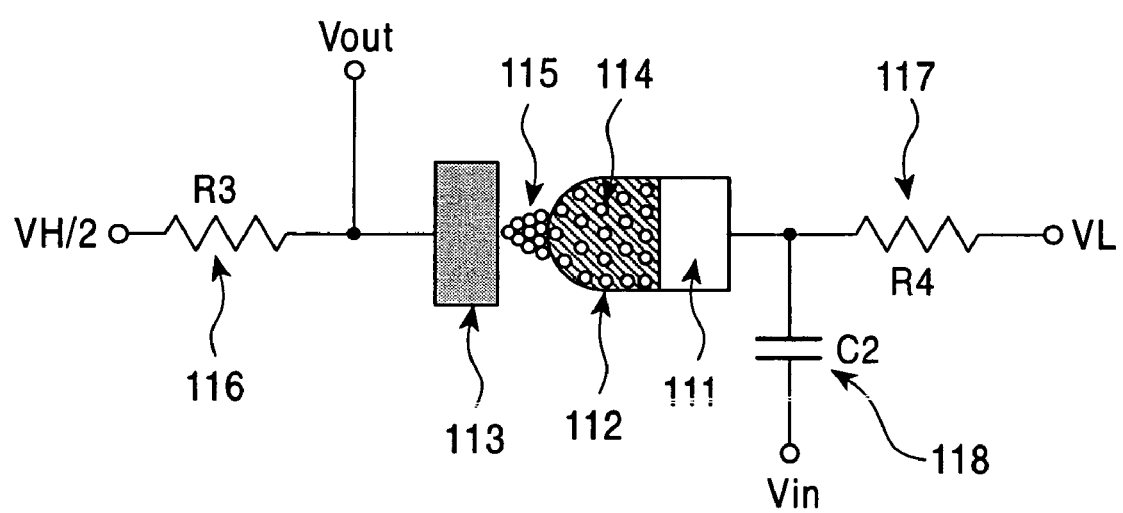
FIG. 16 is a schematic diagram of a NOT circuit according to a tenth embodiment of the present invention.

FIG. 16 is a schematic diagram of a NOT circuit according to a tenth embodiment of the present invention.

A NOT circuit comprising two-terminal devices with arrangement different from that shown in FIG. 14 will now be described as another embodiment.

The used components are exactly the same as those shown in FIG. 14 according to the ninth embodiment. In other words, a first electrode 112 serving as an electronic/ionic mixed conductor ($Ag_2S$) is formed on Ag 111 serving as a conductive substance. Mobile ions (Ag ions) 114 in the electronic/ionic mixed conductor are precipitated to form a bridge 115 comprising Ag atoms between the first electrode 112 and a second electrode (Pt) 113. An atomic switch with the above structure is used.

A voltage VH/2 corresponding to a high-level output is applied to the second electrode (Pt) 113 of the atomic switch through a resistor 116 (resistance R3). An output terminal $V_{out}$ is connected to the second electrode 113.

On the other hand, a voltage VL corresponding to a low-level output is applied to the conductive substance (Ag) 111 constituting the first electrode 112 of the atomic switch through a resistor 117 (resistance R4). An input terminal $V_{in}$ is connected to the first electrode 112 through a capacitor 118 (capacitance C2).

It is assumed that R(ON) denotes a resistance of the atomic switch in the ON state and R(OFF) denotes a resistance of the atomic switch in the OFF state. According to the present embodiment, the resistors and the atomic switch, which satisfy the following relation, are used.

R(OFF)>>R3>>R(ON)~R4

Figure 17:
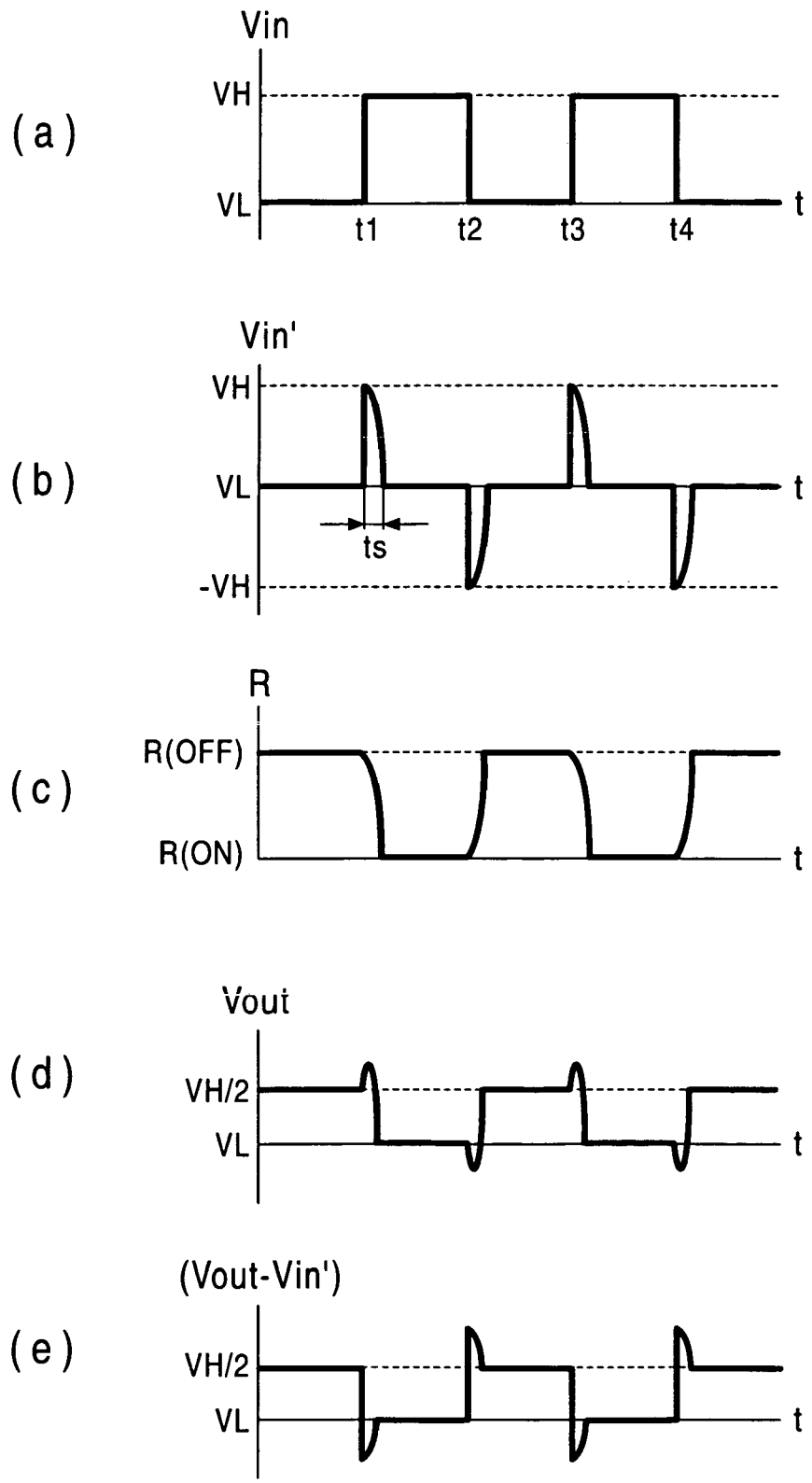
FIG. 17 includes graphs showing a principle of the operation of the NOT circuit according to the tenth embodiment of the present invention.

The principle of operation of the NOT circuit shown in FIG. 16 will now be described in detail with reference to FIG. 17.

When the input $V_{in}$ changes from a low level (VL) to a high level (VH) at time t1 [refer to FIG. 17(a)], charges Q=C2×VH (C2 denotes a capacitance of the capacitor) are accumulated in the capacitor 118. At this time, a potential $V_{in}'$ of the first electrode 112 in the atomic switch changes due to a current, which temporarily flows, as shown in FIG. 17(b). In other words, the potential of the first electrode 112 in the atomic switch is temporarily remarkably higher than that of the second electrode 113, so that the atomic switch changes to the ON state (low resistance) [refer to FIG. 17(c)].

Thus, R3>>R(ON). The output $V_{out}$ indicates VL [refer to FIG. 17(d)]. Switching time ts is almost determined by the capacitance C2 of the capacitor 118 and the resistance R4 of the resistor 117. For instance, when it is assumed that the capacitance C2 of the capacitor is 1 pF and the resistance R4 is 10 Ω, switching can be performed on the order of gigahertzs.

On the other hand, when the input $V_{in}$ changes from the high level (VH) to the low level (VL) at time t2 [refer to FIG. 17(a)], the charges accumulated in the capacitor 118 are discharged. Due to a current which temporarily flows, the potential $V_{in}'$ of the first electrode 112 in the atomic switch changes as shown in FIG. 17(b). In other words, the potential of the first electrode 112 in the atomic switch is temporarily remarkably lower than that of the second electrode 113, so that the atomic switch changes to the OFF state (high resistance) [refer to FIG. 17(c)]. Consequently, R(OFF)>>R3. The output $V_{out}$ indicates VH/2 [refer to FIG. 17(d)].

FIG. 17(e) shows the potential difference between the electrodes 112 and 113 of the atomic switch. When the input $V_{in}$ is at the low level (VL), the potential difference between the electrodes 112 and 113 of the atomic switch indicates VH/2. This value indicates a potential difference at which the atomic switch should be in the OFF state. Therefore, the OFF state is held stably.

On the other hand, when the input $V_{in}$ is at the high level (VH), the potential difference between the two electrodes 112 and 113 of the atomic switch indicates substantially zero. Thus, the ON state of the atomic switch is held stably. In other words, the NOT circuit according to the present embodiment operates with reliability and stability.

According to the embodiment, the case where VH and VL are used as inputs and VH/2 and VL are used as outputs is described. In the same case as the NOT circuit according to the ninth embodiment (FIG. 14), under limitations that a potential difference between inputs has to always be larger than a potential difference between outputs, the potential difference between inputs and that between outputs can be freely set within the limitations.

For the arrangement of the atomic switch, the resistors, and the capacitor, and the number of each device, the pattern other than that of the above-mentioned embodiment can be made. The principal characteristics of the present invention are to use the above devices as components.

Figure 18:
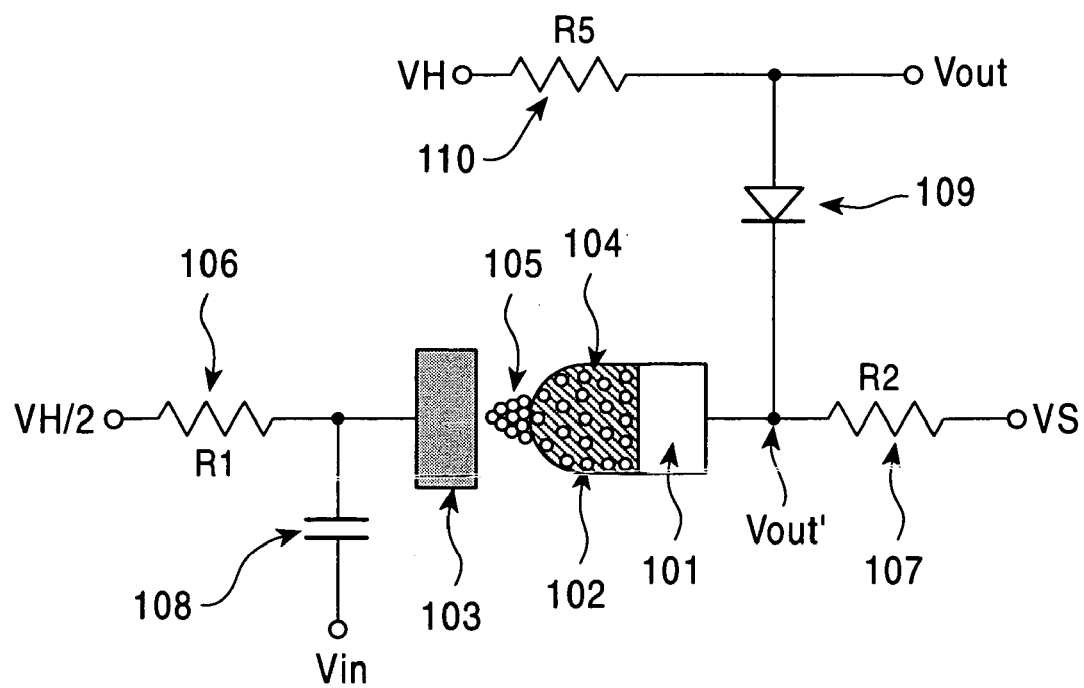
FIG. 18 is a schematic diagram of a NOT circuit according to an eleventh embodiment of the present invention.
Figure 19:
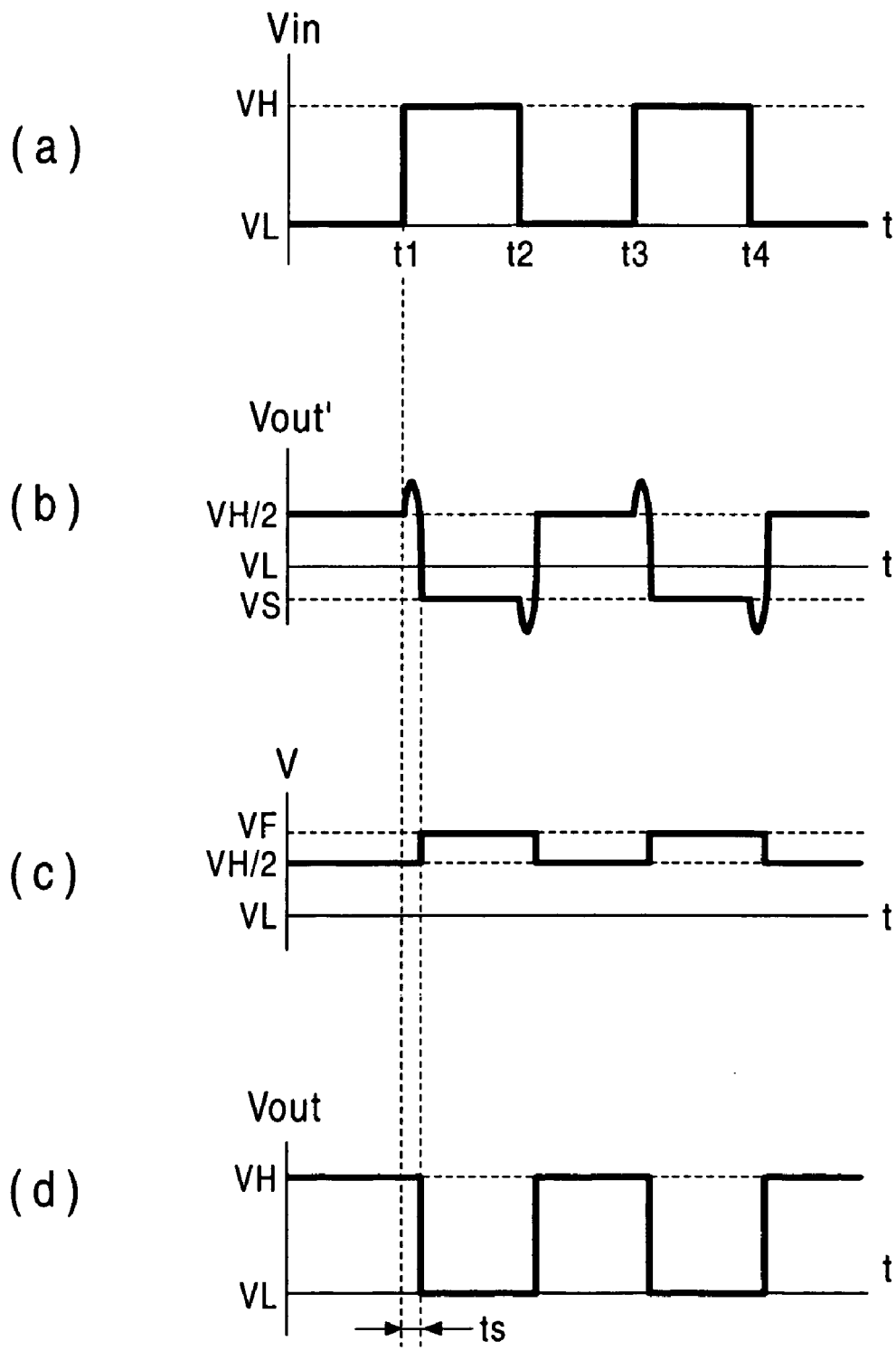
FIG. 19 includes graphs showing a principle of the operation of the NOT circuit according to the eleventh embodiment of the present invention.

FIG. 18 is a schematic diagram of a NOT circuit according to the eleventh embodiment of the present invention. FIG. 19 includes graphs showing the principle of operation of the NOT circuit shown in FIG. 18.

The NOT circuit in which a potential difference between inputs is equivalent to that between outputs will now be described. A diode 109 is connected to a portion ($V_{out}'$ in FIG. 18) corresponding to the output of the NOT circuit according to the ninth embodiment (FIG. 14). VH is applied to the other end of the diode 109 through a resistor 110 (resistance R5). An output terminal $V_{out}$ is connected to the other end thereof. Further, the present NOT circuit differs from the NOT circuit according to the ninth embodiment (FIG. 14) with respect to a point that a voltage to be applied through the resistor 107 (resistance R2) is not VL, but VS.

The potential of $V_{out}'$ is changed in the same way as the ninth embodiment except that the low level is not VL, but VS [refer to FIG. 19(b)]. According to the present embodiment, by satisfying the relation of VH/2<VF(VH–VS) (VF denotes a threshold voltage of the diode 109), the potential difference between inputs is equalized to that between outputs in the NOT circuit. In other words, when $V_{out}'$ indicates VH/2, a voltage that is equal to or lower than the threshold voltage is applied to the diode 109. It is assumed that RB denotes a resistance of the diode 109 at this time and RF denotes a resistance thereof when a voltage that is equal to or higher than the threshold. The resistor 110 which satisfies the relation of RB>>R5>>RF is used. FIG. 19(c) shows a voltage to be applied to the diode. The resistances and a voltage to be applied are set so as to satisfy the following expressions.

$$R5/R2=(VH-VL)/(VL-VF-VS)$$

$$VL>VF+VS$$

Thus, the output $V_{out}$ is changed as shown in FIG. 19(d). In other words, the NOT circuit in which the potential difference between inputs is equivalent to that between outputs can be realized.

Figure 20:
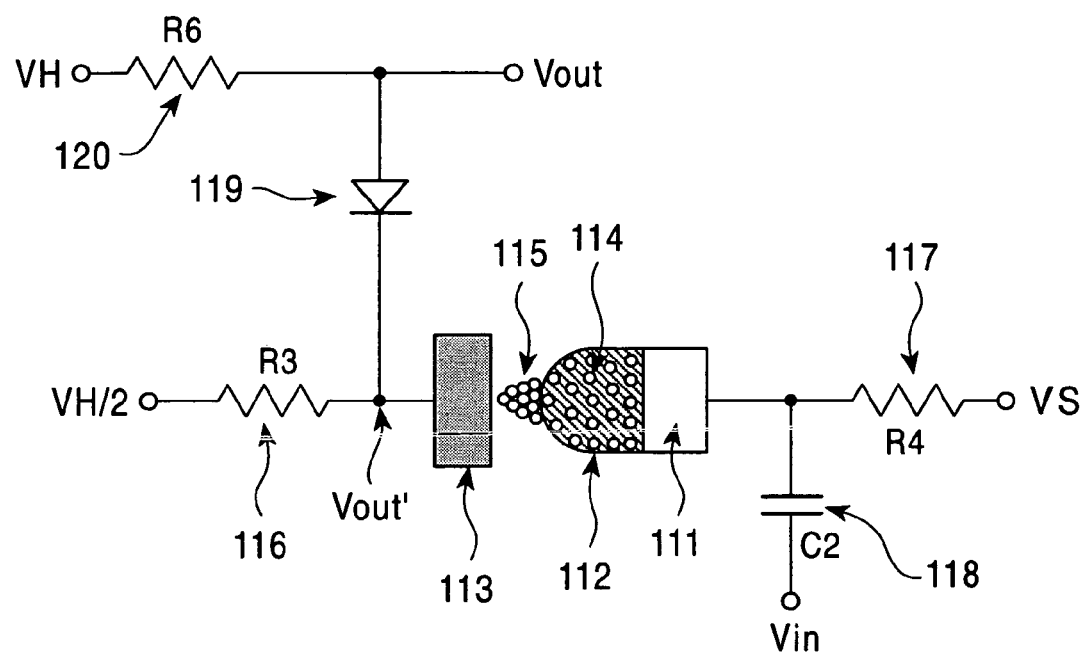
FIG. 20 is a schematic diagram of a NOT circuit according to a twelfth embodiment of the present invention.

FIG. 20 is a schematic diagram of a NOT circuit according to a twelfth embodiment of the present invention.

A NOT circuit in which a potential difference between inputs is equivalent to that between outputs can be formed on the basis of the NOT circuit according to the tenth embodiment shown in FIG. 16. A diode 119 is connected to a portion ($V_{out}'$) corresponding to the output of the NOT circuit according to the tenth embodiment (FIG. 16). VH is applied to the other end of the diode 119 through a resistor 120 (resistance R6). An output terminal $V_{out}$ is connected to the other end thereof. Further, the present NOT circuit differs from the NOT circuit according to the tenth embodiment with respect to a point that the voltage applied through the resistor 117 (resistance R4) is not VL, but VS.

The principle of operation is substantially the same as that of the NOT circuit described in the eleventh embodiment. The resistor 120 which satisfies the relation of RB>>R6>>RF is used and the resistances and a voltage to be applied are set so as to satisfy the following expressions.

$$R6/2R4=(VH-VL)/(VL-VF-VS)$$

$$VL>VF+VS$$

On this condition, the NOT circuit in which the potential difference between inputs is equivalent to that between outputs can be realized. In the above case, the resistance of the atomic switch is substantially equivalent to R4. When the condition does not apply, it is necessary to control VS to some extent.

When the diode and the resistor are added to the NOT circuit in which the atomic switch, the resistors, and the capacitor are arranged according to various patterns, the above-mentioned NOT circuit in which the potential difference between inputs is equivalent to that between outputs can be constructed. In other words, the arrangement of the atomic switch, the resistors, the capacitor, and the diode is not limited to that described in the present embodiment. The present invention is characterized in that these devices are used as components.

Figure 21:
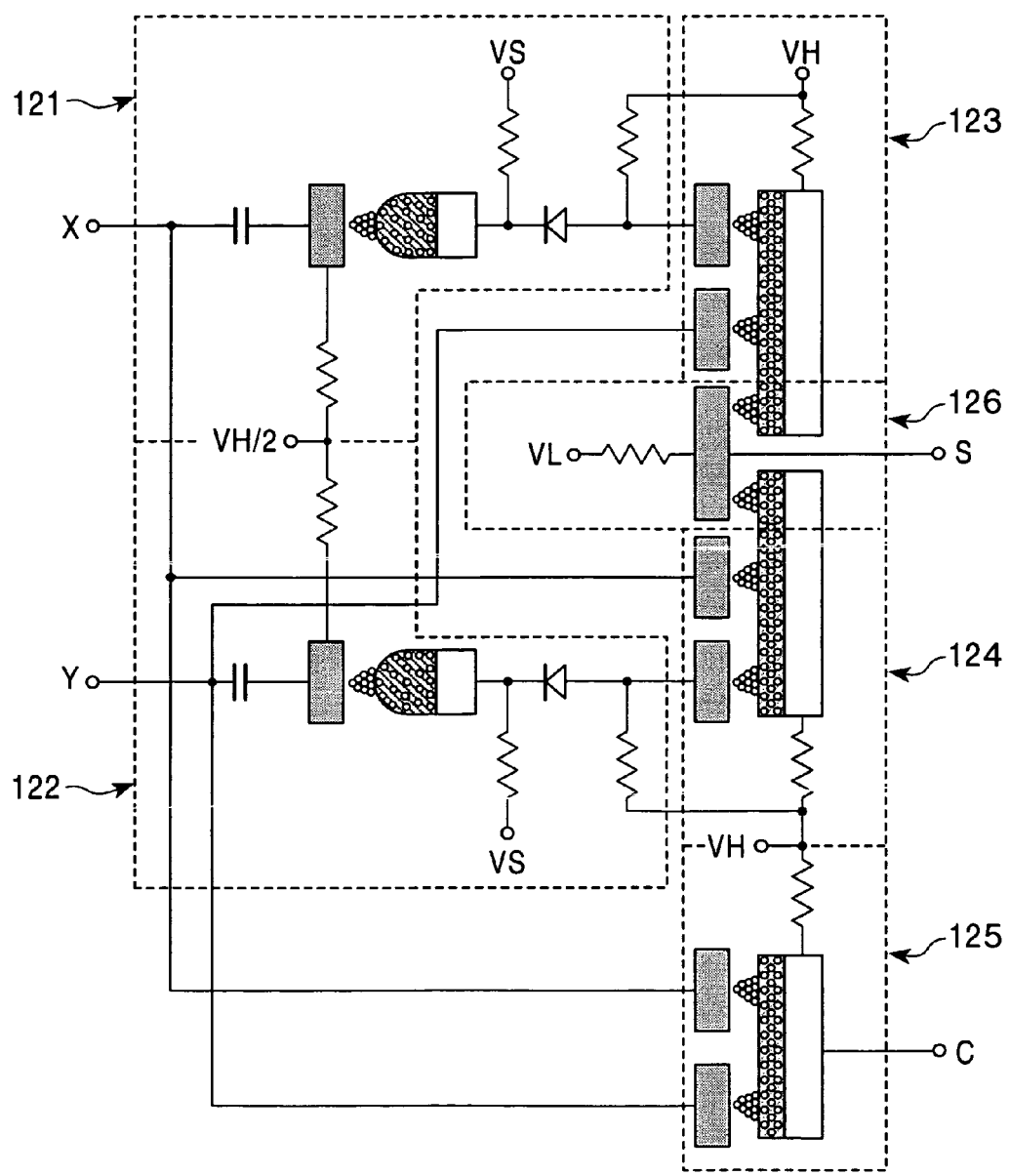
FIG. 21 is a schematic diagram of a one-digit binary adder according to a thirteenth embodiment of the present invention.

FIG. 21 is a schematic diagram of a one-digit binary adder according to a thirteenth embodiment of the present invention.

According to the present embodiment, a case where the one-digit binary adder comprises a NOT circuit according to the present invention, an AND circuit, and an OR circuit, the AND circuit and the OR circuit each having an atomic switch, will be described.

The NOT circuit according to the eleventh embodiment shown in FIG. 18 is used. The AND circuit and the OR circuit, proposed by the inventors of the present application in Japanese Patent Application No. 2000-334686, are used. In the diagram, respective parts corresponding to the NOT circuit, the AND circuit, and the OR circuit are surrounded by dotted lines. In other words, the present one-digit binary adder comprises two NOT circuits 121 and 122, three AND circuits 123, 124, and 125, and one OR circuit 126.

Figures 22, 23:
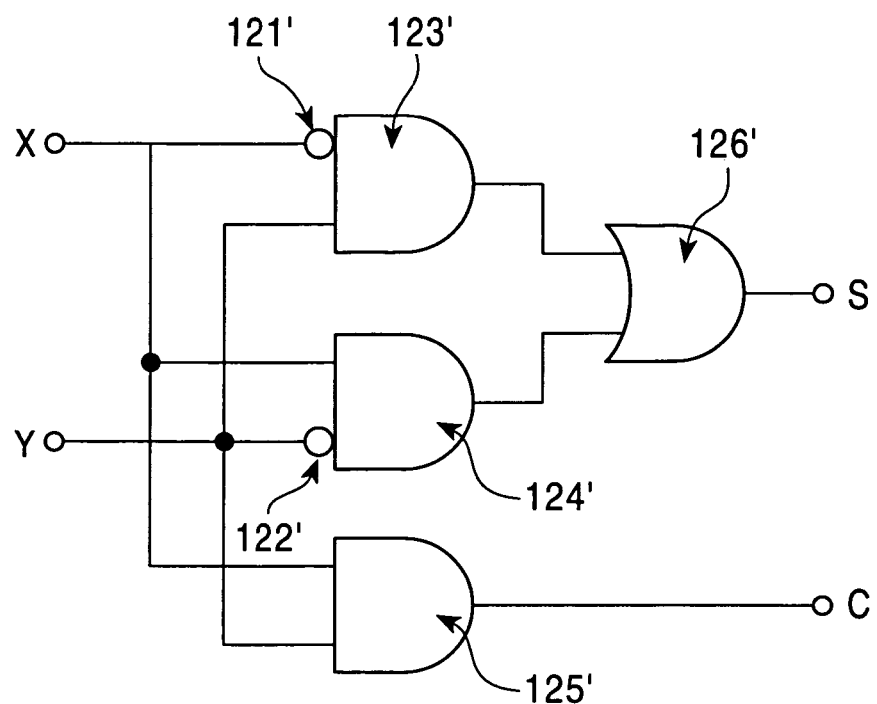
FIG. 22 is a diagram showing logical symbols of the one-digit binary adder according to the thirteenth embodiment of the present invention.
FIG. 23 is a diagram showing a truth table of the one-digit binary adder according to the thirteenth embodiment of the present invention.

FIG. 22 shows the circuits using logical symbols. In FIG. 22, reference numerals 121' and 122' denote the NOT circuits, 123', 124', and 125' denote the AND circuits, and 126' denotes the OR circuit.

For inputs X and Y, it is assumed that a high-level input indicates 1 and a low-level input indicates 0. Outputs S and C are as shown in FIG. 23. According to the present invention, the one-digit binary adder, which is applied to a computer, can be constructed. This case is one example. According to the present invention, a NOT circuit, an AND circuit, and an OR circuit can be constructed using two-terminal devices. Accordingly, all of logic circuits can be constructed using only the two-terminal devices.

The present invention is not limited to the above embodiments. Various modifications are possible on the basis of the spirit of the present invention and are not excluded from the scope of the present invention.

As mentioned above, according to the present invention, the following advantages can be obtained.

(A) A high-speed point contact array with low power consumption can be constructed, resulting in the realization of a multiple recording memory device, a logic circuit, and an arithmetic circuit.

(B) Since a NOT circuit can be constructed using two-terminal devices, all of logic circuits can be realized using only the two-terminal devices. A nanometer-sized atomic switch can be easily formed. According to the present invention, therefore, a nanometer-scale device can be realized.

INDUSTRIAL APPLICABILITY

A point contact array, a NOT circuit, and an electronic circuit using the same according to the present invention are applicable to a logic circuit, an arithmetic circuit, and a memory device which are nano-scale.

The invention claimed is:

1. An electric circuit comprising:
a plurality of atomic switches, each atomic switch including
a first electrode made of a compound conductive material which is $Ag_2S$, $Ag_2Se$, $Cu_2S$, or $Cu_2Se$, including mobile ions, and having ionic conductivity and electric conductivity, and
a second electrode made of a conductive substance configured to control conductance between the first and second electrodes, and to be spaced apart from the first electrode, wherein the mobile ions can form a bridge between the first and second electrodes
at least one NOT circuit, each NOT circuit including
one of the plurality of atomic switches, and
a resistor and a capacitor, each of which serves as a two-terminal device;
at least one AND circuit configured to use one of the plurality of the atomic switches; and
an OR circuit configured to use one of the plurality of the atomic switches.

2. The electric circuit according to claim 1, wherein the at least one NOT circuit includes a diode in addition to the resistor and the capacitor.

3. The electric circuit according to claim 2, wherein a voltage to be applied to one of the plurality of atomic switches, used by the at least one NOT circuit, to control the conductance between the electrodes of the one of the plurality of atomic switches used by the at least one NOT circuit, is controlled through the capacitor.

4. The electric circuit according to claim 1, wherein the at least one AND circuit includes
a first AND circuit configured to use one of the plurality of atomic switches, the one of the plurality of atomic switches used by the first AND circuit being connected to a first NOT circuit comprised in the at least one NOT circuit, wherein the first NOT circuit is connected to a first input terminal;

a second AND circuit configured to use one of the plurality of atomic switches, the one of the plurality of atomic switches used by the second AND circuit being connected to a second NOT circuit comprised in the at least one NOT circuit, wherein the second NOT circuit is connected to a second input terminal; and a third AND circuit configured to use one of the plurality of atomic switches, wherein the one of the plurality of atomic switches used by the third AND circuit is configured to include a second output terminal, and to be connected to the first and second input terminals; and the OR circuit is configured to use one of the plurality of atomic switches, wherein the one of the plurality of atomic switches used by the OR circuit is configured to include a first output terminal, the first output terminal being connected to each output of the first and second AND circuits.

* * * * *